United States Patent
Lin et al.

(10) Patent No.: US 8,908,439 B2
(45) Date of Patent: Dec. 9, 2014

(54) ADAPTIVE WORD-LINE BOOST DRIVER

(71) Applicant: Taiwan Semiconductor Manufacturing Co., Ltd., Hsin-Chu (TW)

(72) Inventors: Ku-Feng Lin, New Taipei (TW); Hung-Chang Yu, Hsin-Chu (TW); Kai-Chun Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 76 days.

(21) Appl. No.: 13/706,380

(22) Filed: Dec. 6, 2012

(65) Prior Publication Data

US 2014/0071750 A1 Mar. 13, 2014

Related U.S. Application Data

(60) Provisional application No. 61/697,870, filed on Sep. 7, 2012.

(51) Int. Cl.
| | |
|---|---|
| *G11C 8/08* | (2006.01) |
| *G11C 16/08* | (2006.01) |
| *G11C 16/06* | (2006.01) |
| *G11C 11/408* | (2006.01) |

(52) U.S. Cl.
CPC ............ *G11C 16/08* (2013.01); *G11C 16/06* (2013.01); *G11C 11/4085* (2013.01); *G11C 8/08* (2013.01)
USPC ............ 365/185.21; 365/185.23; 365/189.11; 365/230.06

(58) Field of Classification Search
CPC .......... G11C 8/08; G11C 16/06; G11C 16/08; G11C 11/413; G11C 11/4085; G11C 13/0028
USPC ................. 365/185.2, 185.23, 189.11, 230.06
See application file for complete search history.

(56) References Cited

U.S. PATENT DOCUMENTS

| | | | | |
|---|---|---|---|---|
| 5,268,871 | A * | 12/1993 | Dhong et al. | 365/226 |
| 5,392,253 | A * | 2/1995 | Atsumi et al. | 365/230.06 |
| 6,297,994 | B1 * | 10/2001 | Ahn et al. | 365/189.07 |
| 7,372,754 | B2 * | 5/2008 | Hwang et al. | 365/218 |
| 7,450,429 | B2 | 11/2008 | Daga | |
| 8,526,265 | B2 * | 9/2013 | Sim | 365/230.06 |
| 2004/0156230 | A1 | 8/2004 | Satomi et al. | |
| 2010/0302880 | A1 * | 12/2010 | Wang et al. | 365/189.11 |

FOREIGN PATENT DOCUMENTS

WO    2011163022  A2    12/2011

OTHER PUBLICATIONS

Official Action issued Mar. 20, 2014 in counterpart Korean Patent Application No. 10-2013-0010864.
Official Action issued Sep. 30, 2014 in counterpart Korean Patent Application No. 10-2013-0010864.

* cited by examiner

*Primary Examiner* — Tan T. Nguyen
(74) *Attorney, Agent, or Firm* — Duane Morris LLP

(57) ABSTRACT

A word line driver circuit includes a first transistor having its gate coupled to a first node configured to receive a word line select signal. A second transistor has its gate coupled to the first node and a drain coupled to a drain of the first transistor at a second node that is coupled to a word line. A word line assist control circuit is coupled to the first node, to the word line, and to a gate of a third transistor. The word line assist control circuit is configured to turn on or turn off the third transistor to adjust a voltage of the word line.

20 Claims, 9 Drawing Sheets

ADAPTIVE WORD-LINE BOOST DRIVER

CROSS-REFERENCE TO RELATED APPLICATIONS

This application claims priority to U.S. provisional patent application 61/697,870, filed Sep. 7, 2012, the entirety of which is herein incorporated by reference.

FIELD OF DISCLOSURE

The disclosed system and method relate to semiconductor integrated circuits. semiconductor memories. More particularly, the disclosed system and methods relate to semiconductor memories for integrated circuits.

BACKGROUND

Micro-controller units (MCU) are widely used in electronics and are typically implemented with embedded flash (eflash). In high-end applications, such as the control of automotive powertrain systems, high-performance MCUs are indispensable to the agility, safety, and efficiency of an automotive vehicle. The eflash memories implemented in MCUs have fast read speeds. However, conventional designs of such eflash memories suffer from slow word line rise time and sensing speeds.

DETAILED DESCRIPTION

This description of the exemplary embodiments is intended to be read in connection with the accompanying drawings, which are to be considered part of the entire written description.

An adaptive word line (WL) driver (AWD) and an adaptive word line boost driver (AWBD) are disclosed. In one example, the AWD/AWBD are disclosed for a 90 nm embedded flash technology to implement 200 MHz direct-access-read high speed eflash memory that can maintain high-speed operation under wide range power supply from 2.5 V to 3.6 V. Dual power/voltage supplies of VDD (e.g., a voltage supply for core devices, which may be set at 1.2 V) and VDIO (e.g., a voltage supply for input/output devices, which may be set at 3.3 V) are applied to the eflash macro and the power supply of VDIO can range from 2.5 V to 3.6 V. One of ordinary skill in the art will understand that the AWD/AWBD can otherwise be implemented.

Figure 1:
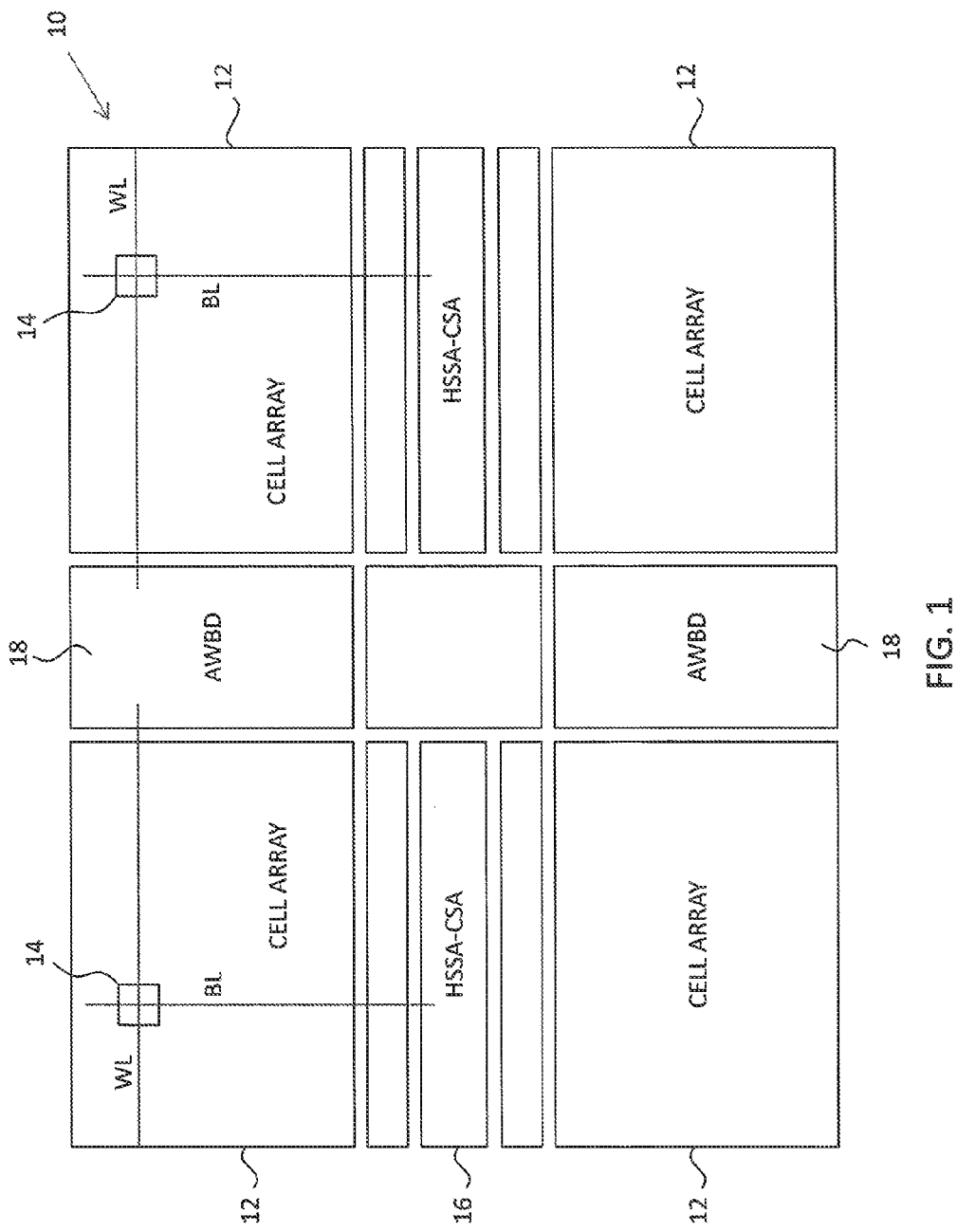
FIG. 1 is a block diagram of one example of a high-speed embedded flash memory along with tables of operating conditions in accordance with some embodiments.

FIG. 1 illustrates one example of a block diagram of an eflash macro 10 in accordance with some embodiments. Macro 10 includes a plurality of cell arrays 12 each of which includes a plurality of memory bit cells 14. Bit cells 14 are arranged in rows, which are coupled to word lines ("WL"), and columns, which are coupled to bit lines ("BL"). A high-speed sensing assist (HSSA) HSSA current-mode sense amplifier (CSA) blocks 16 are coupled between a pair of vertically adjacent cell arrays 12 and are configured to sense the voltages on the bit lines during reading operations. AWD/AWBD blocks 18 are disposed between horizontally adjacent cell arrays 12 and are configured to drive word lines to particular voltages during reading and writing operations.

In some embodiments, the bias condition for a word line voltage (VWL) is 2.5 V, the bit line voltage (VBL) is 0.8 V, and the source line voltage (VSL) is 0 V during a read operation. Consequently, the devices used to implement WL drivers can be the same devices used for input/output ("IO") devices.

The inventors have discovered that with conventional WL drivers, a 2.5 V supply voltage can be directly derived from a linear voltage regulator but that IO devices will be under driven by this 2.5 V supply voltage. Under-driving the WL results in the rising time of VWL being as slow as 1.63 ns in a worst case condition. Slow word line activation results in a bottleneck for high-speed read operation.

Figure 2:
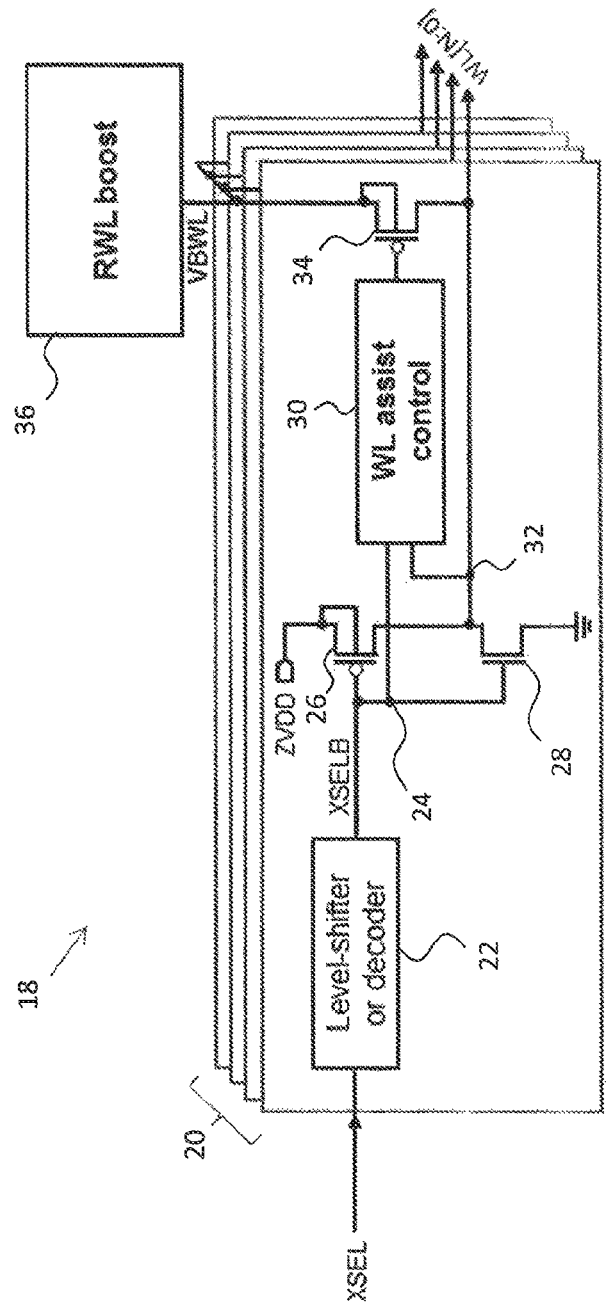
FIG. 2 illustrates one example of an adaptive word-line boost driver in accordance with some embodiments.

To achieve high speed operation under wide range power supply of VDIO from 2.5 V to 3.6 V, for example, the arrangement of AWD/AWBD 18 enables the WL voltage to be pulled up to voltage to 2.5 V within 1 ns. FIG. 2 illustrates one example of AWBD 18 in accordance with some embodiments. In some embodiments, the AWBD illustrated in FIG. 2 is implemented by core devices and IO devices. For example, a core device is driven by VDD, and an IO device is driven by VDIO and an intermediate voltage supply (ZVDD) that is 2.5 V and is supplied by a linear voltage regulator.

As shown in FIG. 2, AWBD 18 includes a plurality of WL drivers 20 each configured to receive a select voltage signal, XSEL. A level shifter or decoder 22 is configured to receive the XSEL signal and shift the voltage level from VDD to ZVDD such that a signal, XSELB, is output to node 24. Node 24 is coupled to the gates of transistors 26 and 28 and to an input of a WL assist control block 30. In some embodiments, transistor 26 is a PMOS transistor having its source coupled to a voltage supply node set at ZVDD and its drain coupled to node 32. Transistor 28 has its source coupled to ground and its drain coupled to node 32.

In addition to being coupled to the drains of transistors 26 and 28, node 32 is coupled to WL assist control block 30 and to the drain of transistor 34. Node 32 serves as the output of WL driver 20. The output of WL assist control block 30 is coupled to the gate of transistor 34, which has its drain coupled to a read word line ("RWL") boost circuit 36.

Figure 3:
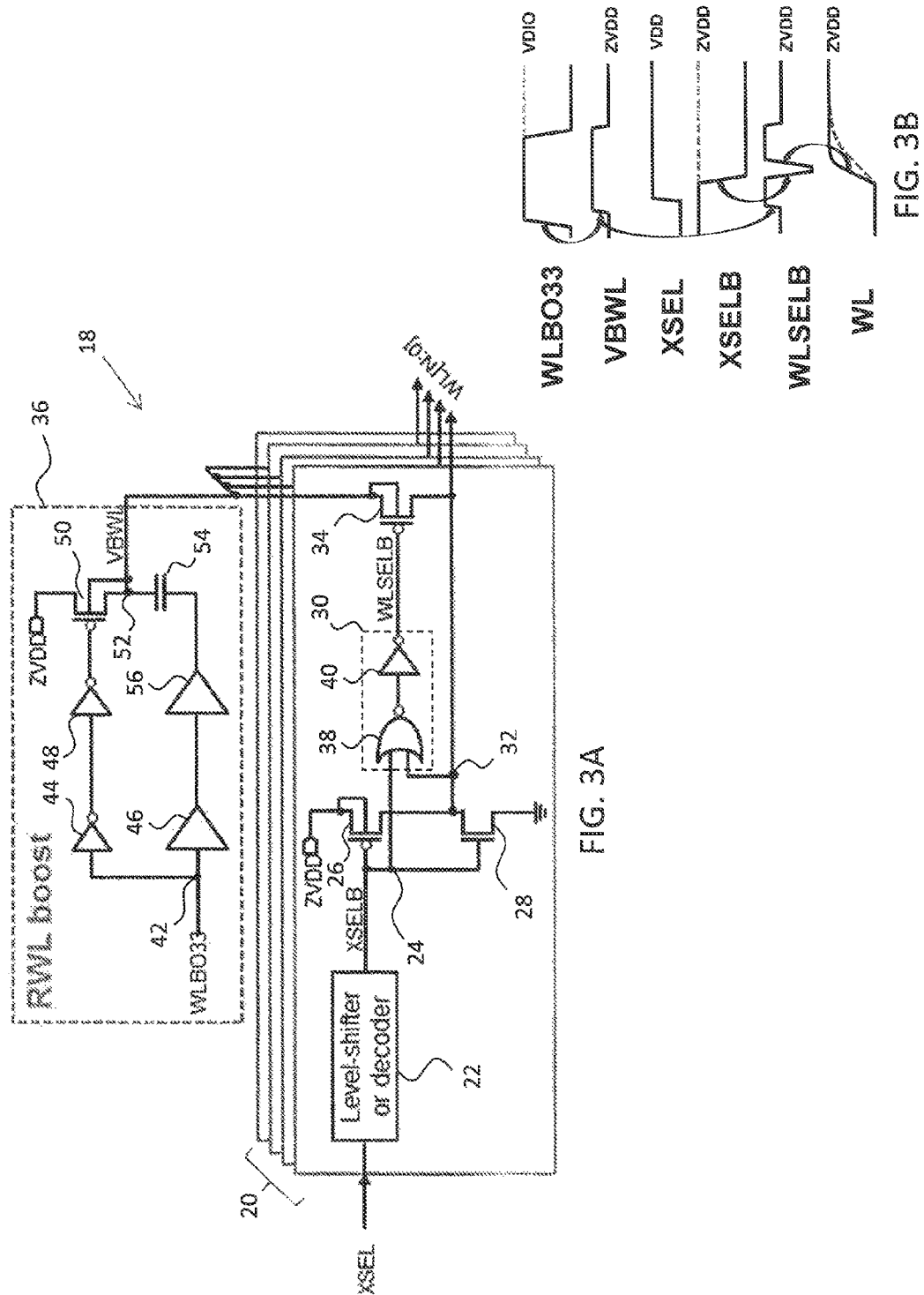
FIG. 3A is a circuit diagram of one example of an adaptive word line boost driver in accordance with some embodiments.
FIG. 3B is a timing diagram of various signals of the adaptive word line boost driver illustrated in FIG. 3A.

WL assist control block 30 and RWL boost circuit 36 can be implemented in a variety of ways. For example, FIG. 3A is a more detailed circuit diagram of AWBD circuit 18 configured with a WL assist control block 30 and RWL boost circuit 36. As shown in FIG. 3A, WL assist control block 30 includes a logic gate 38 coupled to an inverter 40. Logic gate 38, which is illustrated as a NOR gate, includes a first input coupled node 24 and a second input coupled to node 32. The output of logic gate 38 is coupled to the input of inverter 40, which has its output coupled to the gate of transistor 34.

RWL boost circuit 36 includes an input node 42, which is configured to receive signal WLBO33, that is coupled to the inputs of inverter 44 and buffer 46. The output of inverter 44 is coupled to the input of inverter 48, which has its output coupled to the gate of transistor 50. The source of transistor 50 is coupled to a voltage supply node set at ZVDD, and the drain of transistor 50 is coupled to node 52. Node 52 serves as the output node of RWL boost circuit 36 and is coupled to the source of transistor 34 of WL driver 20 and to capacitor 54. Capacitor 54 is coupled to the output of buffer 56, which has its input coupled to the output of buffer 46.

FIG. 3B illustrates various signals of the AWBD circuit 18 illustrated in FIG. 3A. As shown in FIG. 3B, the transition of signal WLBO33 from logic low to a logic high causes VBWL increase above the voltage level of ZVDD. The XSEL signal transitions from low to high, and XSELB is level shifted and transitions from a logic high to a logic low.

The increase in the voltage level of VBWL causes WLSELB to increase, and the voltage level XSELB being level shifted down decreases the voltage of WLSELB. The transition of WLSELB to a voltage level that is below the level of ZVDD causes the voltage of the WL to increase, which then causes the voltage of WLSELB to increase as WL assist control block 30 is disposed in a feedback loop of the WL.

Figure 4:
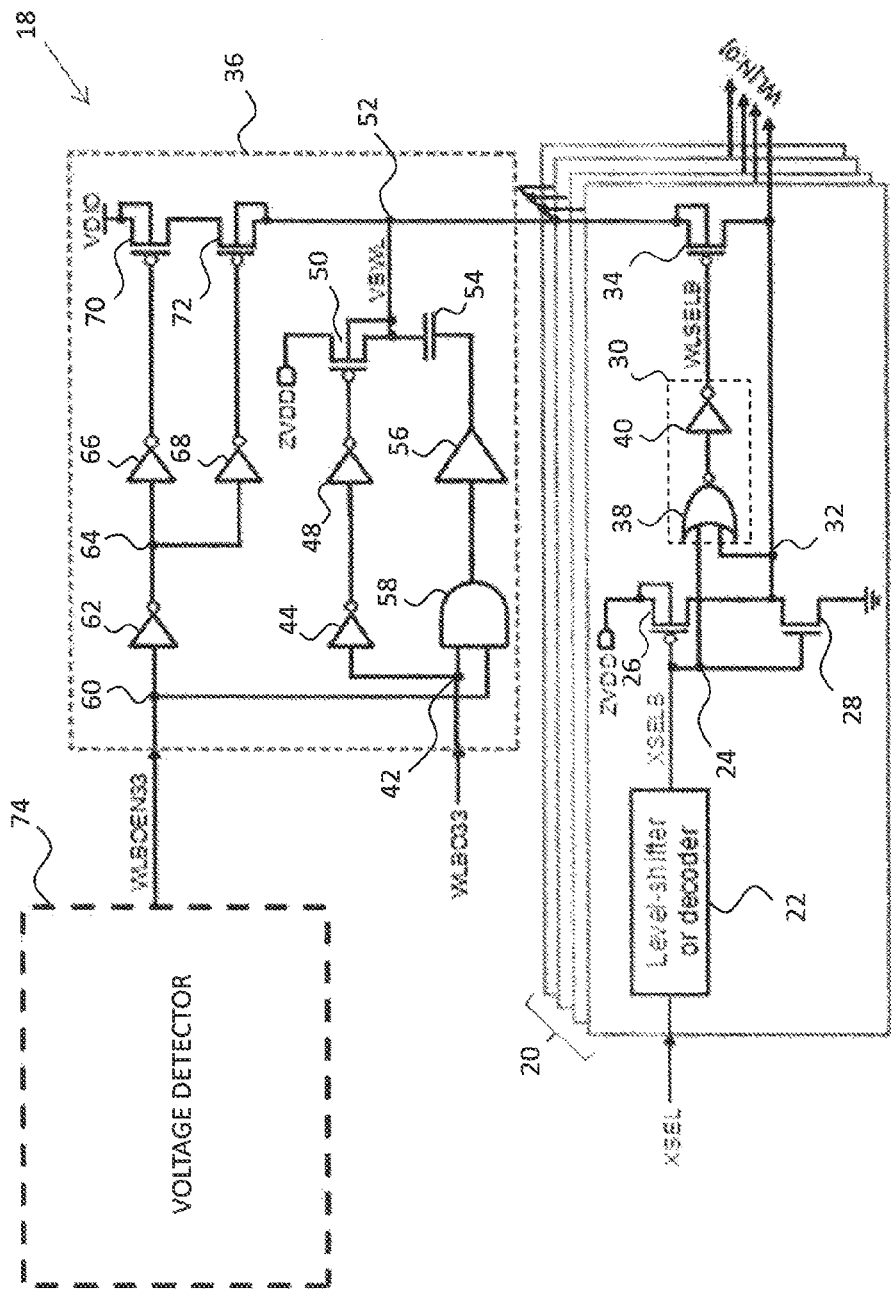
FIG. 4 is a circuit diagram of an example of an adaptive word line boost driver including a voltage detector in accordance with some embodiments.

FIG. 4 illustrates another embodiment of an AWBD 18 in which RWL boost circuit 36 includes an input node 42 that is coupled to an input of logic gate 58 and to an input of inverter 44. The output of logic gate 58 is coupled to the input of buffer 56. A second input of logic gate 58, which is illustrated as an AND gate, is coupled to node 60 that is coupled to an input of inverter 62. The output of inverter 62 is coupled to node 64, which is coupled to respective inputs of inverters 66 and 68.

The output of inverter 66 is coupled to the gate of transistor 70, which has its source coupled to a voltage supply set at VDIO and its drain coupled to the source of transistor 72. Transistor 72 has its gate coupled to the output of inverter 68 and its drain coupled to node 52, which serves as the output of RWL boost circuit 36. RWL boost circuit 36 receives a control signal, WLBOEN33 from a voltage detector 74, which is coupled to input node 60.

Figure 5:
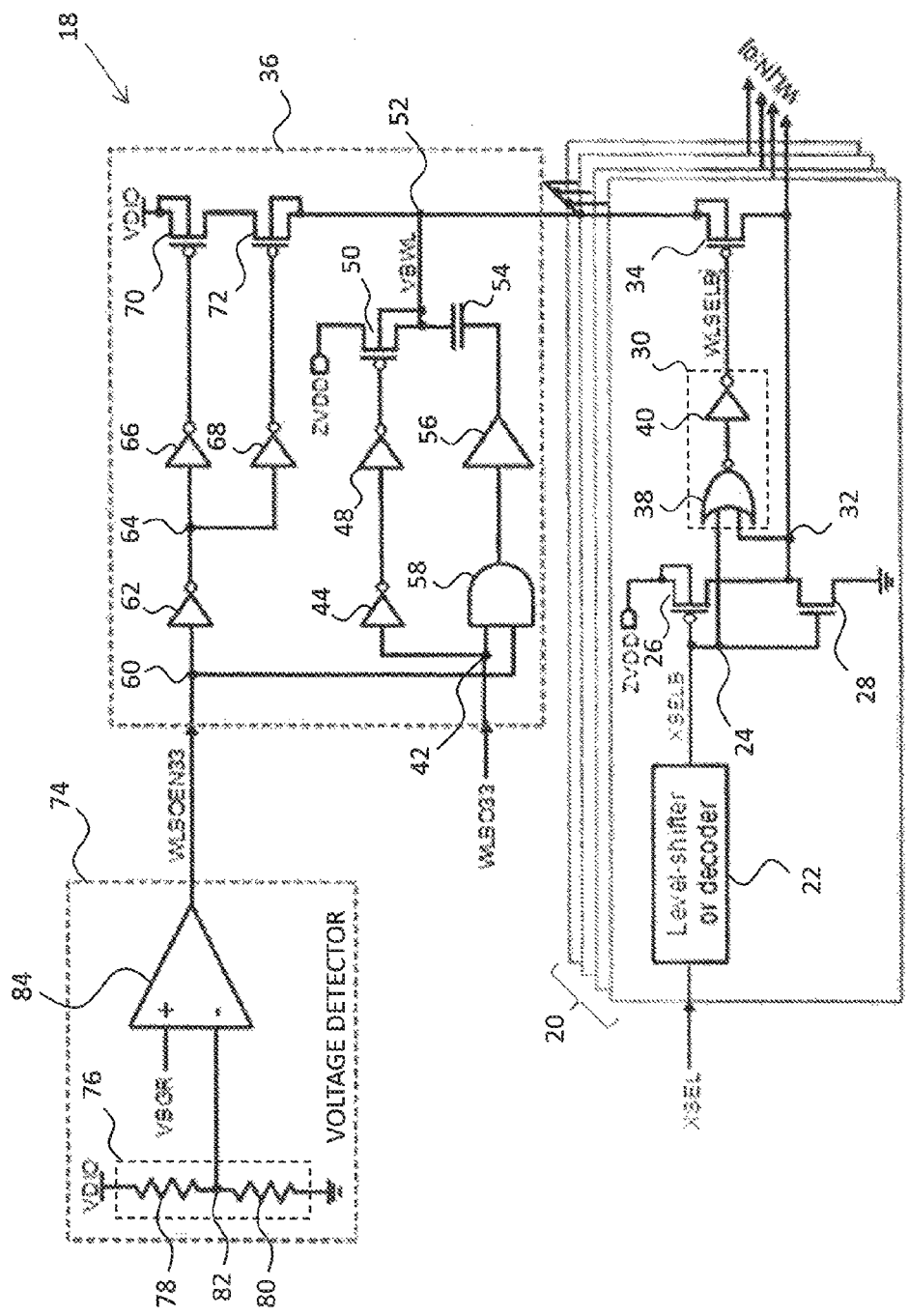
FIG. 5 is a circuit diagram of another example of an adaptive word line boost driver including a voltage detector in accordance with some embodiments.

FIG. 5 illustrates one example of a voltage detector 74 that is configured to provide RWL boost circuit 36 with voltage WLBOEN33. As shown in FIG. 5, voltage detector 74 includes a voltage divider 76 comprising resistors 78, 80, which are coupled in series with each other at node 82. Although voltage divider 76 is illustrated as including two transistors, one of ordinary skill in the art will understand that voltage divider 76 can be configured with other numbers of transistors. Node 82 is coupled to an input of operational amplifier ("op amp") 84, which has another input that receives a reference voltage, VBGR. The output of op amp 84 supplies node 60 of RWL boost circuit 36 with signal WLBOEN33.

Figure 6:
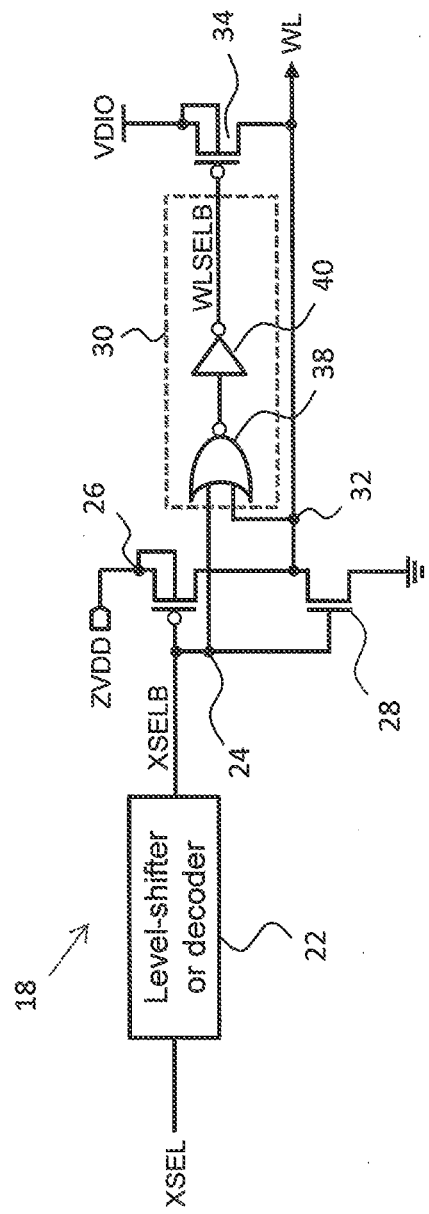
FIG. 6 is a circuit diagram of an example of an adaptive word line driver in accordance with some embodiments.

In some embodiments, such as the embodiment illustrated in FIG. 6, an AWL 18 is implemented with an WL assist control circuit 30 and without an RWL boost circuit 36. As shown in FIG. 6, a level shifter/decoder circuit 22 receives a WL select signal, XSEL, and outputs a level-shifted/decoded signal XSELB to node 24. Node 24 is coupled to the gates of transistors 26 and 28 and to the input of logic gate 38 of WL assist control circuit 30. The drain of transistor 26 is coupled to the drain of transistor 28 at node 32.

Node 32 is coupled to the WL and to an input of logic gate 38. The output of logic gate 38 is coupled to the input of inverter 40, which has its output coupled to the gate of transistor 34. In some embodiments, transistor 34 has its source directly coupled to a voltage supply node set at VDIO and its drain directly coupled to the WL.

Figure 7:
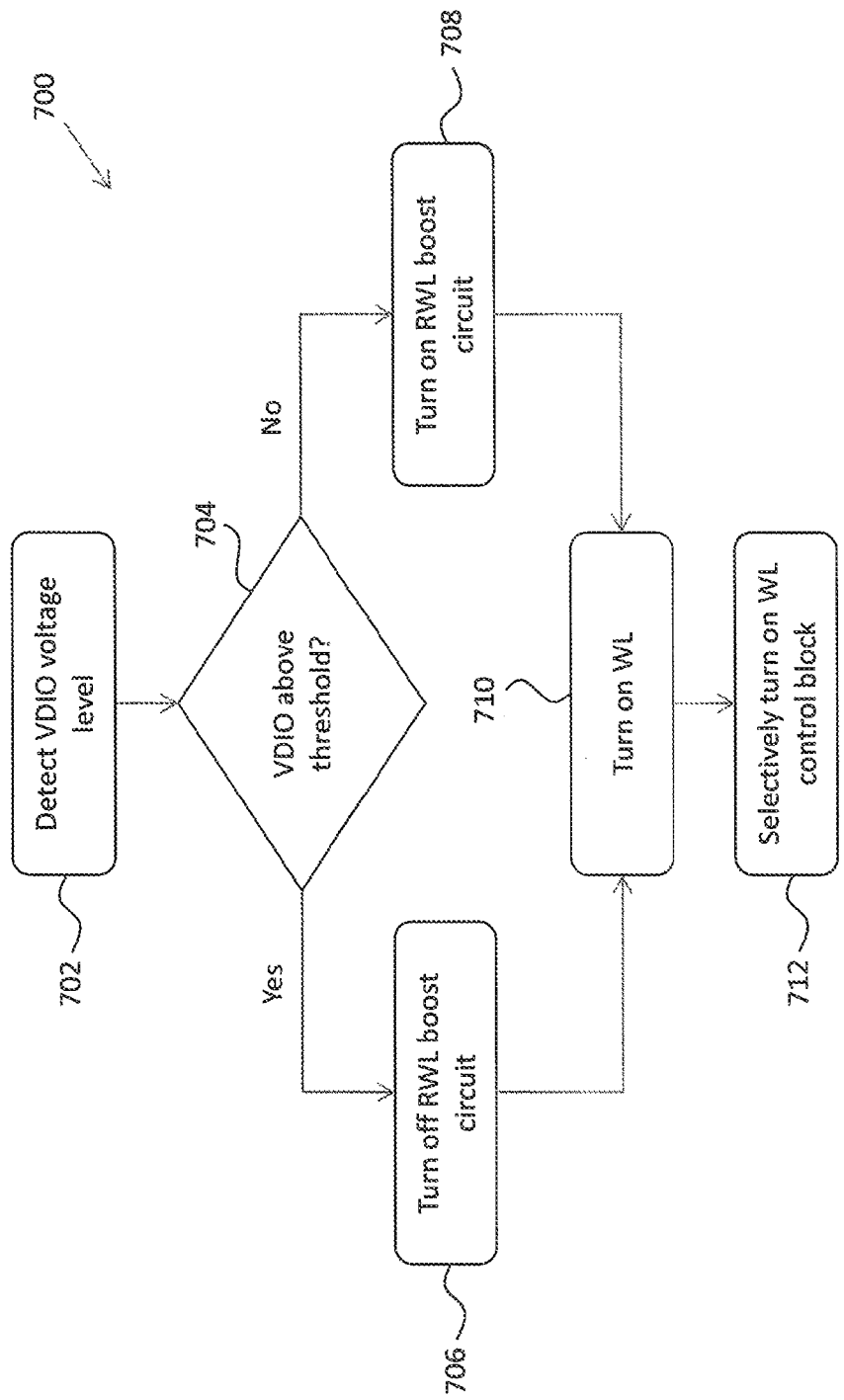
FIG. 7 is a flow diagram of one example of a method of operation of an adaptive word line boost driver in accordance with some embodiments.

The operation of the AWBD circuit 18 illustrated in FIG. 2 is described with reference to FIG. 7, which is a flow diagram of one example of a method 700. At block 702, the voltage level of VDIO is detected. In some embodiments, such as the embodiments illustrated in FIGS. 4 and 5, voltage detector 74 detects the voltage level of VDIO. For example, the voltage at node 82 is sensed by op amp 84, which outputs signal WLBOEN33 identifying the level of VDIO.

Figure 8:
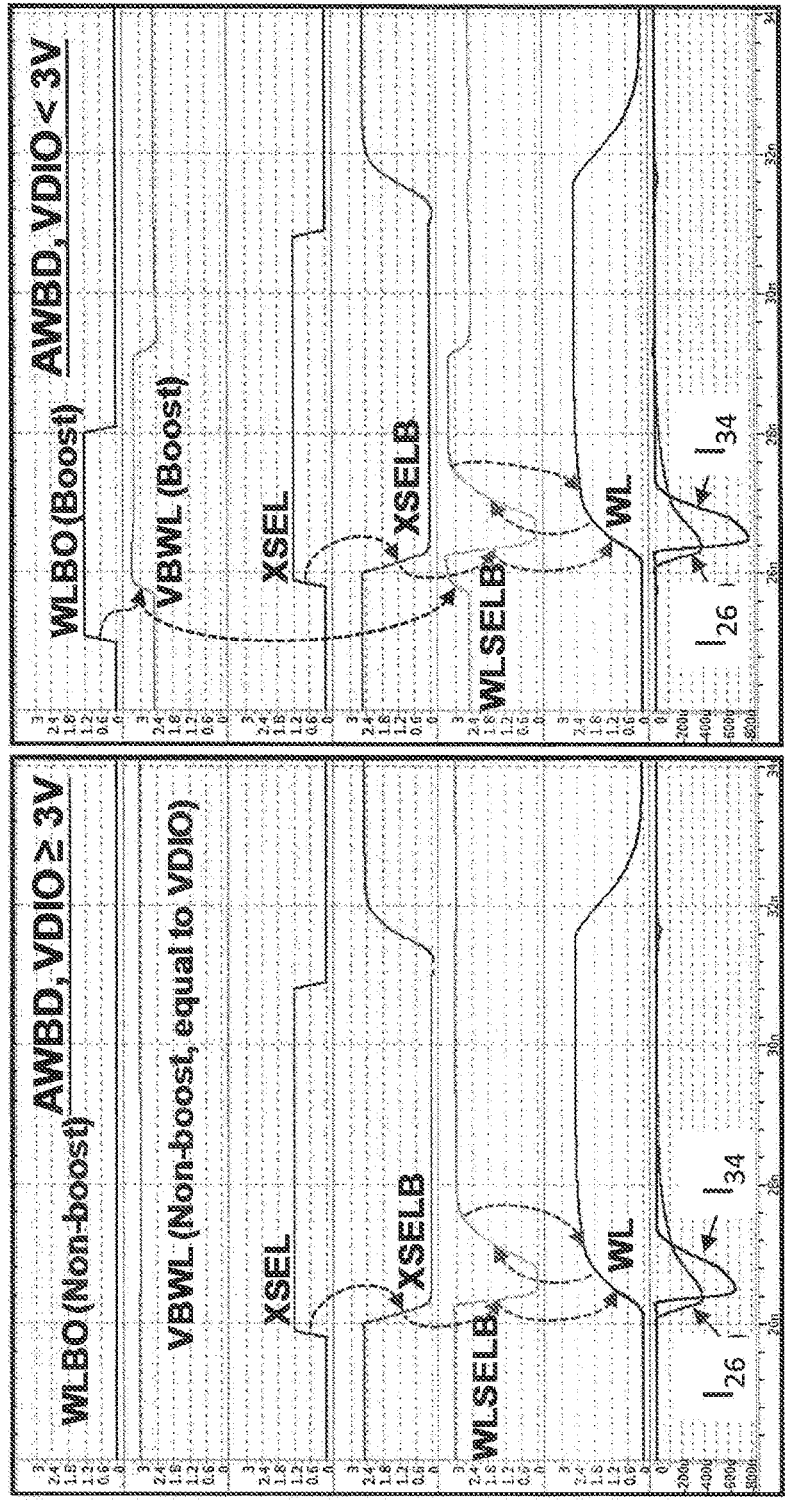
FIG. 8A is a timing diagram of various signals of an adaptive word line boost driver during non-boosting operation.
FIG. 8B is a timing diagram of various signals of an adaptive word line boost driver during a boosting operation.

At decision block 704, it is determined if the level of VDIO is above (or below) a threshold level. If the voltage level of VDIO is larger than a reference voltage, e.g., 3.0 V, then the flow 700 moves to block 706 where the RWL boost circuit 36 is turned off. FIG. 8A illustrates the transitions of various signal lines of an AWBD circuit 18 in accordance with FIGS. 2-5 when an RWL boost circuit 36 is off. In some embodiments, for example, the signal WLBOEN33 output by voltage detector 74 is a low-logic level, e.g., 0 V (VSS level), when VDIO has a voltage greater than a reference voltage, VBGR. The signal WLBO33 is at high-logic level based on the output of op amp 84.

With WLBOEN33 low, the voltage at the gates of transistors 70 and 72 are low, due to the WLBOEN33 signal being twice inverted by inverters 62 and 66 and by inverters 62 and 68. Transistors 70 and 72 are in current-conducting "on" states such that capacitor 54 is charged by the current flowing through transistors 70 and 72 from VDIO. Voltage VBWL, which is the voltage at node 52, is pulled up to VDIO when transistors 70 and 72 are turned on. In some embodiments, the voltage level of VBWL initially is at 0 V and transistor 50 is also on, which helps facilitate pulling up VBWL until VBWL>ZVDD−Vt$_{50}$, where Vt$_{50}$ is the threshold voltage of transistor 50. Transistor 50 transitions to a non-current-conducting "off" state as node 52 continues being pulled up to VDIO.

At block 710, a WL is selected. When a WL is selected, the XSEL signal is shifter and/or decoded by level shifter/decoder block 22, which outputs the level shifted/decoded signal, XSELB, to node 24 as illustrated in FIGS. 5 and 8A. The XSELB signal, which transitions from a logic one or high signal to a logic zero or low signal as can be seen in FIG. 8A, is received at an input of logic gate 38. The second input of logic gate 38 is coupled to node 32, which is initially at a logic zero level. With both inputs of logic gate 38 at logic low levels, the output of logic gate 38 is a logic one. The logic one output from logic gate 38 is inverted by inverter 40, which outputs a logic zero to the gate of transistor 34.

The logic zero at the gate of transistor 34 turns transistor 34 on, and the charge stored on capacitor 54 is shared with the WL capacitance, CWL, such that the word line voltage, VWL, is pulled up quickly. When VWL is pulled up close to 2.5 V, for example, the signal VWL propagates through the feedback loop comprising WL assist control block 30. As described above, WL assist control block 30 includes logic gate 38 and inverter 40 and is configured to turn off the transistor 34 adaptively. With proper design of coupling ratio and gate delay, a VWL voltage of 2.5 V (or other voltage) can be derived without being overcharged.

Referring again to FIG. 7, if at decision block 704 it is determined that the level of VDIO is below the threshold, then method 700 moves to block 708 to turn on the RWL boost circuit 36. FIG. 8B illustrates the transitions of various signals of an AWBD circuit 18 in accordance with FIGS. 2-5 when an RWL boost circuit 36 is off. For example, when VDIO is below the reference voltage, e.g., 3.0 V, stored charge on capacitor 54 drops and VWL is not coupled to 2.5 V. WLBOEN33 is at the logic level of VDIO (e.g., a high-logic level) such that transistors 70 and 72 are turned off in response to receiving a high-logic level from inverters 66 and 68, respectively.

The signal WLBO33 is pulsed and received at node 42 when a read operation is asserted. The pulsed signal passes through inverters 44 and 48 to periodically turn on transistor 50 to charge capacitor 54 to ZVDD. When transistor 50 is off, buffer 56 boosts VBWL from 2.5 V to 3.3 V in response to receiving a high-logic signal from logic gate 58, which outputs the high-logic signal in response to receiving high-logic signals at its two inputs.

At block 710, a WL is selected. When a WL is selected, the XSEL signal is shifter and/or decoded by level shifter/decoder block 22, which outputs the level shifted/decoded signal, XSELB, to node 24 as illustrated in FIGS. 5 and 8A. The XSELB signal, which transitions from a logic one or high signal to a logic zero or low signal as can be seen in FIG. 8A, is received at an input of logic gate 38. The second input of logic gate 38 is coupled to node 32, which is initially at a logic zero level. With both inputs of logic gate 38 at logic low levels, the output of logic gate 38 is a logic one. The logic one output from logic gate 38 is inverted by inverter 40, which outputs a logic zero to the gate of transistor 34.

The selected WL is pulled up to 2.5 V, and the feedback loop comprising WL assist control block 30 turns off transistor 34. Inverters 68 and 48 are supplied by VBWL, and the gate voltage of transistors 72 and 50 adaptively follows VBWL when it is boosted up.

The n-wells of transistors 72 and 50 are coupled to the drain terminals such that charge carriers are not injected into either ZVDD or VDIO through transistors 72 and 50 when VBWL is greater than the reference voltage, e.g., 3.0 V, or the voltage of ZVDD. For example, when VDIO is lower than the reference voltage, the boost operation is activated and VDWL is higher than VDIO and ZVDD such that charge carriers are not injected into VDIO through transistor 72 and into ZVDD through transistor 50. According to the VDIO voltage level, the AWBD 18 can select a charge-coupling scheme or a WL boost scheme to drive WL. The feedback control loop, which includes WL assist control block 30 comprising logic gate 38 and inverter 40, avoids the WL overcharging such that the WL is driven to 2.5 V.

Figure 9:
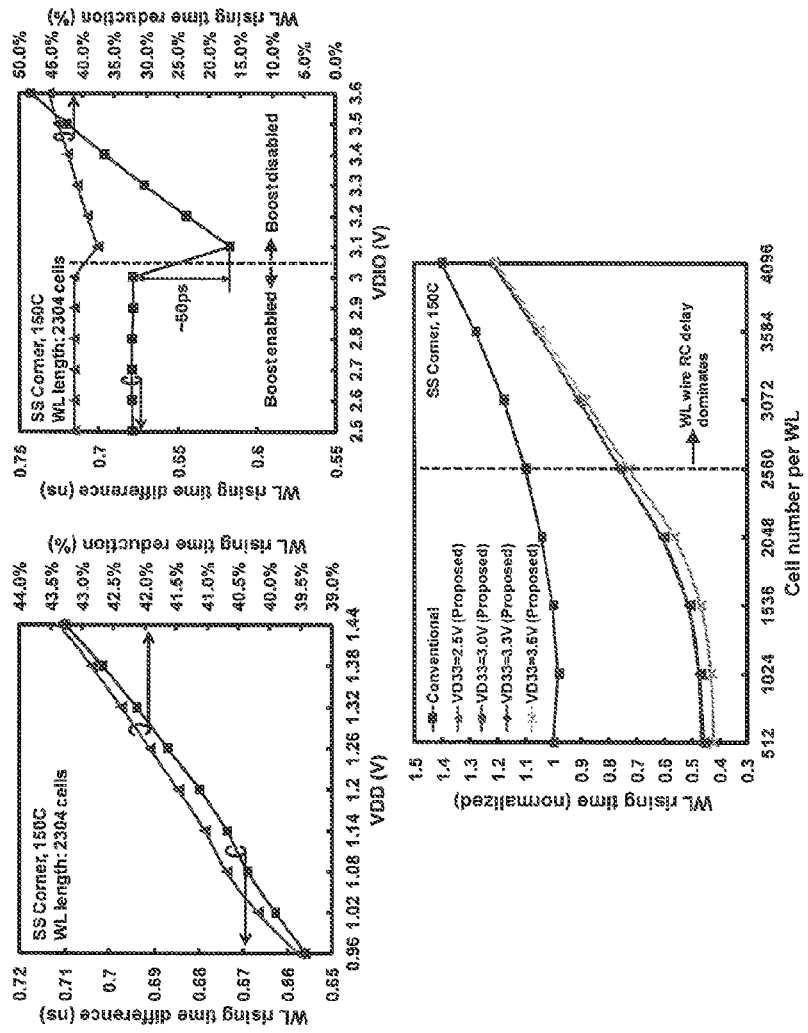
FIG. 9 are graphs of a simulation comparing a conventional word line driver to an adaptive word line driver in accordance with some embodiments.

FIG. 9 compares the performance of a conventional WL driver with an AWBD 18 in accordance with the embodiment illustrated in FIG. 2. The AWBD used in the simulated 4.6 Mb memory reduces the rising time of the WL by approximately 40% across a range of VDD±20% or across the range of VDIO from 2.5 V to 3.6 V. FIG. 9 also demonstrates that if the number of cells per WL is less than 1024, the WL rising time of AWBD is even 50% less than the WL rising time of conventional WL driver.

In some embodiments, a word line driver circuit includes a first transistor having its gate coupled to a first node configured to receive a word line select signal. A second transistor has its gate coupled to the first node and a drain coupled to a drain of the first transistor at a second node that is coupled to a word line. A word line assist control circuit is coupled to the first node, to the word line, and to a gate of a third transistor. The word line assist control circuit is configured to turn on or turn off the third transistor to adjust a voltage of the word line.

In some embodiments, a method includes receiving a word line select signal, selectively coupling a word line to a first voltage supply or to a second voltage supply in response to the word line control signal, and outputting an adjustment signal from a word line assist control circuit coupled to the word line to adjust a voltage of the word line.

In some embodiments, a word line driver circuit includes a first transistor having its gate coupled to a first node configured to receive a word line select signal. A second transistor has its gate coupled to the first node and a drain coupled to a drain of the first transistor at a second node that is coupled to a word line. A word line assist control circuit includes a logic gate coupled to the first node, to the word line, and to a gate of a third transistor. The word line assist control circuit is configured to turn on or turn off the third transistor to adjust a voltage of the word line.

The circuits and methods disclosed herein can advantageously be applied to memories in which the word lines are driving by low voltage sources or by high-threshold devices. The circuits provide short word line rising times for wide-ranges of power supplies. Additionally, the circuits and methods precisely control the word line voltages to avoid overcharging while still providing short rise times.

Although the circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:

1. A word line driver circuit, comprising:
   a first transistor having its gate coupled to a first node configured to receive a word line select signal;
   a second transistor having, its gate coupled to the first node and a drain coupled to a drain of the first transistor at a second node that is coupled to a word line; and
   a word line assist control circuit coupled to the first node, to the word line, and to a gate of a third transistor, the word line assist control circuit configured to turn on or turn off the third transistor to adjust a voltage of the word line.

2. The word line driver circuit of claim 1, wherein the word line assist control circuit includes a logic gate having a first input coupled to the first node, a second input coupled to the second node, and an output coupled to the gate of the third transistor.

3. The word line driver circuit of claim 2, wherein the word line assist control circuit includes an inverter having an input coupled to the output of the logic gate and an output coupled to the gate of the third transistor.

4. The word line driver Circuit of claim 1, wherein the third transistor is coupled to a boost circuit configured to increase a speed at which a voltage level of the word line is increased based on a voltage level of a first voltage supply, 5. The word line driver circuit of claim 4, wherein the boost circuit includes
   a fourth transistor coupled to a second voltage supply and to a third node that is coupled to the third transistor; and
   a capacitor coupled to the third node and configured to charge and discharge in response. to the fourth transistor being turned on and off.

6. The word line driver circuit of claim 5, wherein the boost circuit includes
   a fifth transistor having a source coupled to the first voltage supply, a drain coupled to the third node, and a gate configured to receive a control signal from a voltage detector that generates a control signal in response to comparing a reference voltage to a voltage level based on a voltage of the first voltage supply.

7. The word line driver circuit of claim 4, wherein the boost circuit is coupled to a voltage detector circuit for comparing a reference voltage to a voltage level based on a voltage of the first voltage supply and generating a control signal in response.

8. The word line driver circuit of claim 7, wherein the voltage detector circuit includes
a voltage divider coupled to the first voltage supply; and
an operational amplifier having a first input coupled to the voltage divider and a second input configured to receive the reference voltage, the operational amplifier configured to output the control signal in response to comparing a voltage received from the voltage divider to the reference voltage.

9. A method, comprising:
receiving a word line select signal at a first node that is coupled to a gate of a first transistor, to a gate of a second transistor, and to a word line assist control circuit;
selectively coupling a word line to one of a first voltage level through the first transistor and a second voltage level that is less than the first voltage level through the second transistor in response to the word line select signal; and
outputting an adjustment signal from the word line assist control circuit to a gate of a third transistor to adjust a voltage of the word line.

10. The method of claim 9, further comprising:
determining if a third voltage level is greater than a reference voltage level;
outputting at signal to turn off a boost circuit if the third voltage level is greater than the reference voltage level; and
outputting a signal to turn on a boost circuit to increase the voltage of the word line if the third voltage level is less than the reference voltage.

11. The method of claim 10, wherein determining if the third voltage level is greater than the threshold voltage includes
generating a voltage at a voltage divider that is based on the third voltage level; and
comparing the voltage generated by the voltage divider to the reference voltage.

12. A word line driver circuit, comprising:
a first transistor having its gate coupled to a first node configured to receive a word line select signal;
a second transistor having its gate coupled. to the first node and a drain coupled to a drain of the first transistor at a second node that is coupled to a word line; and
a word line assist control circuit including a logic gate coupled to the first node, to the word line, and to a gate of a third transistor, the word line assist control circuit configured to turn on or turn off the third transistor to adjust a voltage of the word line.

13. The word line driver circuit of claim 12, wherein the word line assist control circuit includes an inverter having an input coupled to the output of the logic gate and an output coupled to the gate of the third transistor.

14. The word line driver circuit of claim 12, wherein the third transistor is coupled to a boost circuit configured to increase a speed at which a voltage level of the word line is increased based on a voltage level of a first voltage supply.

15. The word line driver circuit of claim 14, wherein the boost circuit includes
a fourth transistor coupled to a second voltage supply and to a third node that is coupled to the third transistor; and
a capacitor coupled to the third node and configured to charge and discharge in response to the fourth transistor being turned on and off.

16. The word line driver circuit of claim 15, wherein the boost circuit includes
a fifth transistor having a source coupled to the first voltage supply, a drain coupled to the third node, and a gate configured to receive a control signal from a voltage detector that generates a control signal in response to comparing a reference voltage to a voltage level based on a voltage of the first voltage supply.

17. The word line driver circuit of claim 14, wherein the boost circuit is coupled to a voltage detector circuit for comparing a reference voltage to a voltage level based on a voltage of the first voltage supply and generating a control signal in response.

18. he word line driver circuit of claim 17, wherein the voltage detector circuit includes
a voltage divider coupled to the first voltage supply; and
an operational amplifier having a first input coupled to the voltage divider and a second input configured to receive the reference voltage, the operational amplifier configured to output the control signal in response to comparing a voltage received front the voltage divider to the reference voltage.

19. The word line driver circuit of claim 18, wherein the voltage divider includes first and second resistors coupled together in series between a third voltage supply and the second voltage supply, 20. The word line driver circuit of claim 19, wherein the first input of the voltage divider is coupled to a node disposed between the first and second resistors.

* * * * *

UNITED STATES PATENT AND TRADEMARK OFFICE
CERTIFICATE OF CORRECTION

| | | |
|---|---|---|
| PATENT NO. | : 8,908,439 B2 | Page 1 of 1 |
| APPLICATION NO. | : 13/706380 | |
| DATED | : December 9, 2014 | |
| INVENTOR(S) | : Ku-Feng Lin et al. | |

It is certified that error appears in the above-identified patent and that said Letters Patent is hereby corrected as shown below:

In the Claims:

Claim 1, Column 6, Line 35 – delete "having," and insert -- having --.

Claim 4, Column 6, Line 51 – delete "Circuit" and insert -- circuit --.

Claim 4, Column 6, Line 54 – delete "supply," and insert -- supply. --.

Claim 5, Column 6, Line 60 – delete "response." and insert -- response --.

Claim 10, Column 7, Line 32 – delete "at" and insert -- a --.

Claim 12, Column 7, Line 48 – delete "coupled." and insert -- coupled --.

Claim 18, Column 8, Line 34 – delete "he" and insert -- The --.

Claim 18, Column 8, Line 41 – delete "front" and insert -- from --.

Claim 19, Column 8, Line 46 – delete "supply," and insert -- supply. --.

Signed and Sealed this
Thirteenth Day of October, 2015

Michelle K. Lee
*Director of the United States Patent and Trademark Office*